US011424428B2

(12) United States Patent
Oh et al.

(10) Patent No.: US 11,424,428 B2
(45) Date of Patent: Aug. 23, 2022

(54) ORGANIC LIGHT EMITTING DISPLAY APPARATUS HAVING A SEALING LAYER

(71) Applicant: LG Display Co., Ltd., Seoul (KR)

(72) Inventors: Yeonjun Oh, Gimpo-si (KR); Jaehyeong Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/656,165

(22) Filed: Oct. 17, 2019

(65) Prior Publication Data

US 2020/0152907 A1    May 14, 2020

(30) Foreign Application Priority Data

Nov. 8, 2018   (KR) .......................... 10-2018-0136347

(51) Int. Cl.
*H01L 51/52*   (2006.01)

(52) U.S. Cl.
CPC ...... *H01L 51/5243* (2013.01); *H01L 51/5246* (2013.01); *H01L 51/5253* (2013.01); *H01L 2251/303* (2013.01)

(58) Field of Classification Search
CPC ................................................. H01L 51/5243
USPC ........................................................... 257/40
See application file for complete search history.

(56) References Cited

U.S. PATENT DOCUMENTS

| 2009/0167132 | A1* | 7/2009 | Bae | H01L 51/5243 |
| | | | | 313/1 |
| 2015/0214502 | A1* | 7/2015 | Sato | H01L 51/5246 |
| | | | | 257/88 |
| 2017/0005280 | A1* | 1/2017 | Lee | H01L 27/322 |
| 2017/0148771 | A1* | 5/2017 | Cha | H05K 3/325 |

FOREIGN PATENT DOCUMENTS

| KR | 20160059818 A | * | 5/2016 |
| KR | 10-2018-0073352 A | | 7/2018 |

\* cited by examiner

*Primary Examiner* — Ajay Arora

(74) *Attorney, Agent, or Firm* — Seed IP Law Group LLP

(57) ABSTRACT

Display devices and methods of manufacturing display devices are provided in which a sealing layer is provided on a metal layer, and the metal layer may be removed thereby facilitating removal of the sealing layer, for example, during a repair process. A display device includes a first substrate and a display assembly on the first substrate. The display assembly includes a plurality of sub-pixels, and a portion of the first substrate extends laterally beyond a periphery of the display assembly. A protective layer is provided on the portion of the first substrate that extends laterally beyond the periphery of the display assembly, and a sealing layer is disposed on the protective layer.

29 Claims, 10 Drawing Sheets

ORGANIC LIGHT EMITTING DISPLAY APPARATUS HAVING A SEALING LAYER

CROSS-REFERENCE TO RELATED APPLICATIONS

This application claims the priority of Korean Patent Application No. 10-2018-0136347, filed Nov. 8, 2018, in the Korean Intellectual Property Office, the disclosure of which is incorporated herein by reference.

BACKGROUND

Technical Field

The present disclosure relates to an organic light emitting display apparatus and a method of manufacturing the same. More particularly, the present disclosure relates to an organic light emitting display apparatus which is improved in moisture permeation resistance and also improved in yield by facilitating a repair process and to a method of manufacturing the same.

Description of the Related Art

As the information age advances, the field of display apparatus for visually displaying electrical information signals has grown rapidly. Accordingly, various studies on display apparatuses are ongoing to improve the performance such as by thinning the display apparatus, weight reduction, and reduced power consumption.

Among various display apparatuses, an organic light emitting display apparatus is a self-light emitting display apparatus and does not need a separate light source unlike a liquid crystal display apparatus. Thus, the organic light emitting display apparatus can be manufactured into a lightweight and thin form. Further, the organic light emitting display apparatus is advantageous in terms of power consumption since it is driven with a low voltage. Also, the organic light emitting display apparatus has excellent color expression ability, a high response speed, a wide viewing angle, and a high contrast ratio (CR). Therefore, the organic light emitting display apparatus is expected to be applied to various fields.

BRIEF SUMMARY

In organic light emitting display apparatus, a sealing layer may be formed on an edge area to suppress moisture permeation through a side surface and minimize defects in follow-up processes. However, the sealing layer may be cured through a curing process. Thus, after the sealing layer is formed, if the sealing layer is separated forcibly to perform a repair process, components of the organic light emitting display apparatus can be damaged.

In various embodiments, the present disclosure provides an organic light emitting display apparatus and a method of manufacturing the same. The organic light emitting display apparatus uses a protective layer and a metal layer to facilitate a repair process when a defect occurs during manufacturing of a sealing layer.

In some embodiments, the present disclosure provides an organic light emitting display apparatus and a method of manufacturing the same in which the organic light emitting display apparatus is improved in moisture permeation resistance through the side portion by disposing a multilayer on a side portion.

In some embodiments, the present disclosure provides an organic light emitting display apparatus and a method of manufacturing the same in which the organic light emitting display apparatus is improved in adhesive strength and coating properties of a sealing layer by improving the flatness of an area coated with the sealing layer.

According to various embodiments of the present disclosure, an organic light emitting display apparatus has a structure in which a repair process can be performed to a sealing layer. Thus, the manufacturing yield of the organic light emitting display apparatus can be improved and the manufacturing cost can be reduced.

According to various embodiments of the present disclosure, it is possible to more effectively block moisture which may permeate through a side portion of the organic light emitting display apparatus.

According to various embodiments of the present disclosure, the sealing layer is coated on a flat surface, and, thus, the coating properties can be improved during manufacturing of the sealing layer.

In one or more embodiments, the present disclosure provides a display device that includes a first substrate and a display assembly on the first substrate. The display assembly includes a plurality of sub-pixels, and a portion of the first substrate extends laterally beyond a periphery of the display assembly. A protective layer is disposed on the portion of the first substrate that extends laterally beyond the periphery of the display assembly, and a sealing layer is disposed on the protective layer.

In one or more embodiments, the present disclosure provides an organic light emitting display apparatus that includes a first substrate having an active area and a non-active area at least partially surrounding the active area. A display assembly is disposed in the display area on the first substrate. A flexible film is disposed in the non-active area. A protective layer is disposed in the non-active area, and the protective layer covers at least a portion of the flexible film. A sealing layer is disposed on the protective layer.

In one or more embodiments, the present disclosure provides a method that includes: forming a display assembly in a display area of a substrate, the display assembly including a plurality of sub-pixels, the substrate having a non-display area extending laterally beyond a periphery of the display assembly; forming a protective layer on the substrate in the non-display area; forming a first metal layer on the protective layer in the non-display area; and forming a first sealing layer on the first metal layer in the non-display area. In some embodiments, the first metal layer and the first sealing layer may be removed, and a second layer may be formed on the protective layer in the non-display area.

The effects according to the present disclosure are not limited to the contents described as examples above, and various other effects, features, or advantages of embodiments of the present disclosure are described in the present specification, while still others will be readily appreciated by those skilled in the art in view of the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
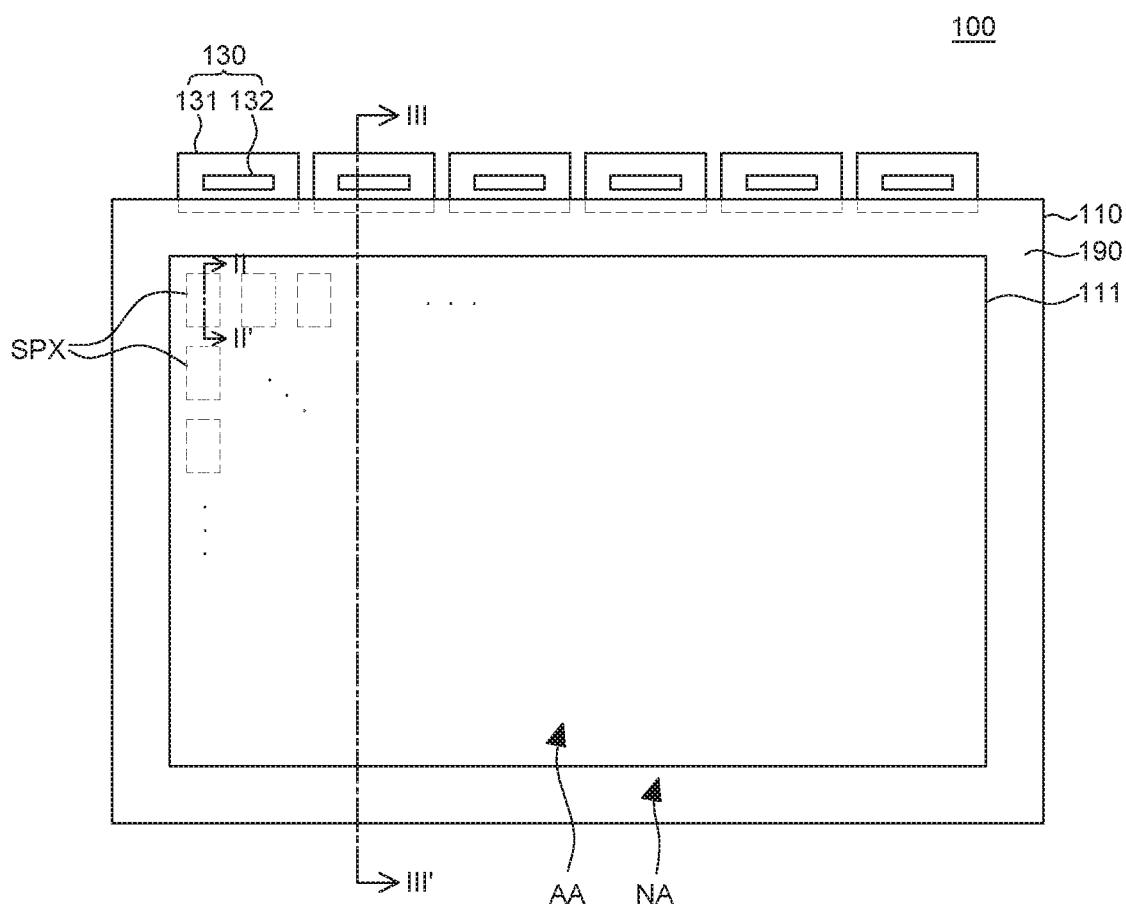
FIG. 1 is a schematic plan view of an organic light emitting display apparatus according to an embodiment of the present disclosure.

Advantages and characteristics of the present disclosure and methods of achieving the advantages and characteristics will be apparent by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including" and "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawings are illustrated for convenience of description, and the present disclosure is not limited to the size and the thickness of the components illustrated.

The features of various embodiments of the present disclosure can be partially or entirely combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
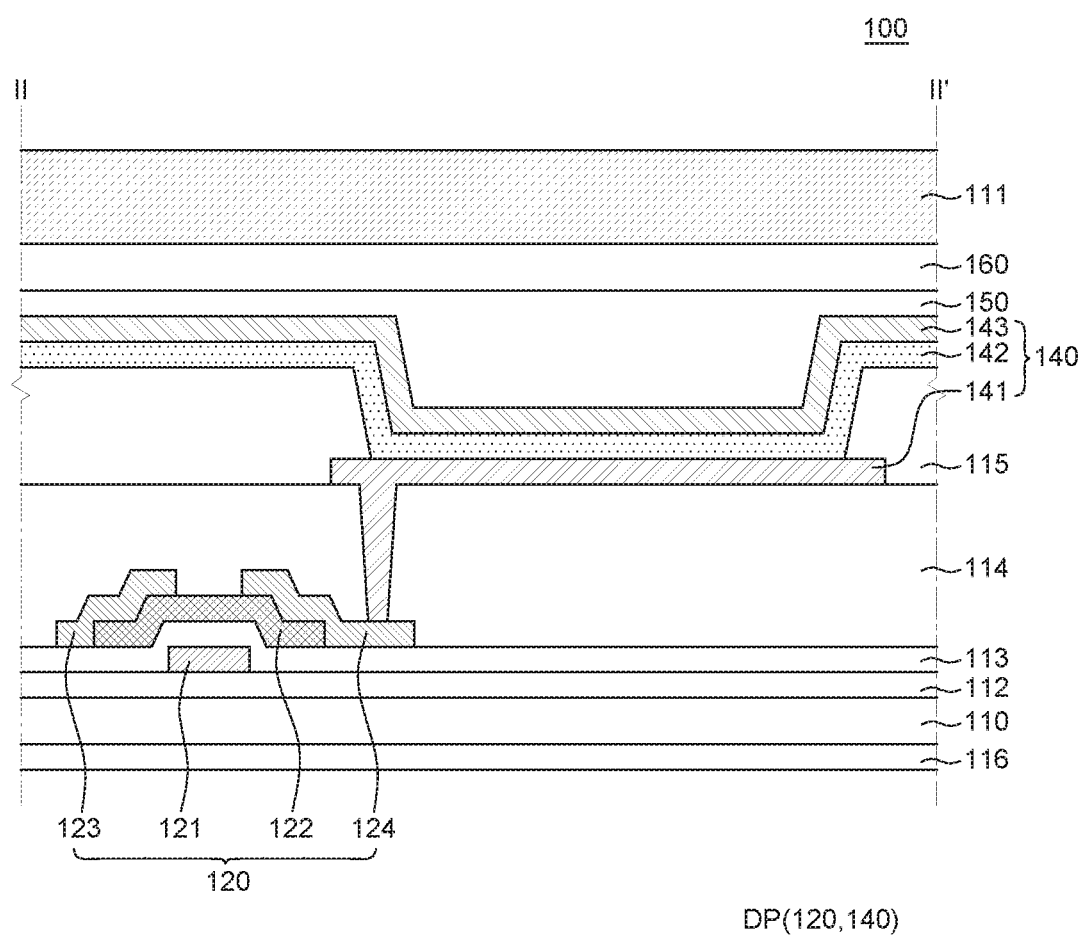
FIG. 2 is a cross-sectional view of the organic light emitting display apparatus as taken along a line II-II' of FIG. 1.
Figure 3:
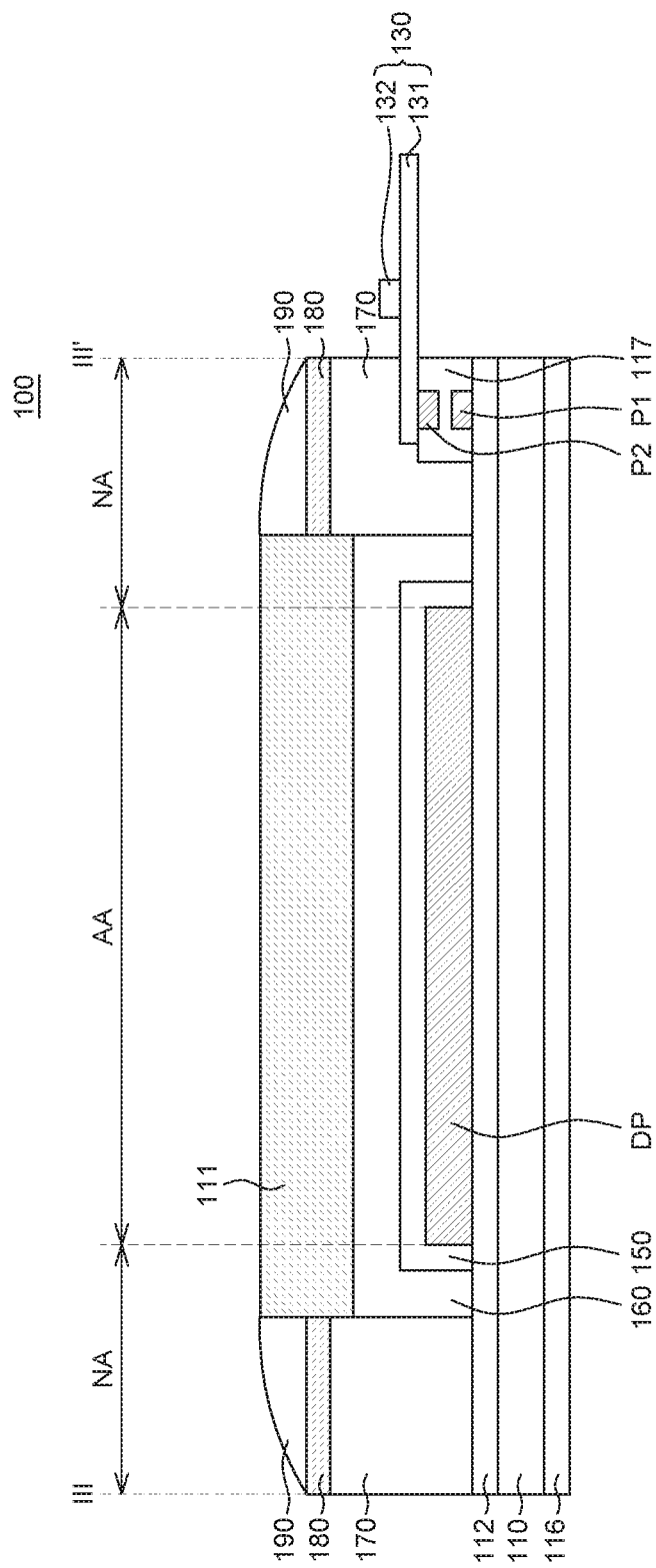
FIG. 3 is a schematic cross-sectional view of the organic light emitting display apparatus as taken along a line III-III' of FIG. 1.

FIG. 1 is a schematic plan view of an organic light emitting display apparatus according to an embodiment of the present disclosure. FIG. 2 is a cross-sectional view of the organic light emitting display apparatus as taken along a line II-II' of FIG. 1. FIG. 3 is a schematic cross-sectional view of the organic light emitting display apparatus as taken along a line III-III' of FIG. 1. For convenience of illustration, FIG. 1 illustrates only certain components, such as a lower substrate 110, an upper substrate 111, a flexible film 130, and a sealing layer 190 among various components of an organic light emitting display apparatus 100. Also, FIG. 3 schematically illustrates a display assembly DP (which may be referred to herein as a display part DP) of the organic light emitting display apparatus 100 which includes a plurality of sub-pixels from which images may be displayed and which may include a variety of additional components. Hereafter, the organic light emitting display apparatus 100 according to an embodiment of the present disclosure will be described as being of a bottom emission type.

Referring to FIG. 1 through FIG. 3, the organic light emitting display apparatus 100 includes the lower substrate 110, a thin film transistor 120, and an organic light emitting element 140. The organic light emitting display apparatus 100 also includes the flexible film 130, a protective layer 170, a metal layer 180, the sealing layer 190, and the upper substrate 111.

The lower substrate 110 serves as a base member to support the other components of the organic light emitting display apparatus 100 and may be formed of an electrically insulating material. The lower substrate 110 may be formed of a material having flexibility. Thus, the organic light emitting display apparatus 100 according to some embodiments of the present disclosure can be applied to, or may be, various types of flexible display apparatuses such as a foldable display apparatus, a rollable display apparatus, and a stretchable display apparatus. The lower substrate 110 may be formed of a plastic material such as polyimide (PI).

The lower substrate 110 includes an active area AA and a non-active area NA.

The active area AA refers to an area where a plurality of sub-pixels SPX is disposed and an image is displayed, and the active area AA may be referred to herein as a display area. In the active area AA, a plurality of sub-pixels SPX for displaying an image and circuitry for driving the plurality of sub-pixels SPX may be disposed. Each of the plurality of sub-pixels SPX may be considered a minimum unit for emitting light. The plurality of sub-pixels SPX may include, for example, a red sub-pixel, a green sub-pixel, a blue sub-pixel, and a white sub-pixel, but embodiments are not limited thereto. The circuitry for driving the plurality of sub-pixels SP, which may be referred to herein as a circuit unit, may include various thin film transistors 120, capacitors, and conductive wiring or lines for driving the sub-pixels SP. For example, the circuitry may include various components such as a driving thin film transistor, a switching thin film transistor, a storage capacitor, a gate line, and a data line, but embodiments are not limited thereto. The circuitry for driving the plurality of sub-pixels SPX may include, for example, a plurality of pixel circuits that are connected to, and may be located proximate to, the sub-pixels SP, and each of the pixel circuits may include, for example, a driving thin film transistor, a switching thin film transistor, and a storage capacitor. Moreover, the circuitry for driving the plurality of sub-pixels may include circuitry (e.g., conductive lines such as gate lines, data lines, or the like) that is connected to a plurality of sub-pixels, such as to a row or a column of the sub-pixels SP.

The non-active area NA refers to an area where an image is not displayed, and the non-active area NA may be referred to herein as a non-display area. In the non-active area NA, various drivers or driving circuitry for driving the plurality of sub-pixels SPX in the active area AA may be disposed. For example, a gate driving circuit, a gate driver IC, a data driver IC, the flexible film 130, and the like, may be disposed in the non-active area NA, but the present disclosure is not limited thereto.

The non-active area NA may refer to an area surrounding the active area AA, as illustrated in FIG. 1. However, the present disclosure is not limited thereto. The non-active area NA may be defined as an area extended from the active area AA.

Referring to FIG. 2 and FIG. 3, a buffer layer 112 as an inorganic insulting layer is disposed on the lower substrate 110. The buffer layer 112 may be disposed on a front surface of the lower substrate 110. The buffer layer 112 serves to enhance adhesive strength between the lower substrate 110 and layers formed on the buffer layer 112. Further, the buffer layer 112 serves to block alkali elements discharged from the lower substrate 110. The buffer layer 112 may be formed of a single layer of silicon nitride (SiNx) or silicon oxide (SiOx) or a multilayer of silicon nitride (SiNx) or silicon oxide (SiOx), but embodiments are not limited thereto. The buffer layer 112 may be omitted in some embodiments depending on the kind and material of the lower substrate 110 and a structure and type of the thin film transistor 120. The buffer layer 112 may be formed only in the active area AA in some embodiments, and in other embodiments, the buffer layer 112 may extend at least partially into the non-active area NA.

Referring to FIG. 2, the thin film transistor 120 is disposed on the lower substrate 110. The thin film transistor 120 may be used as a driver (e.g., it may be included as a part of a pixel circuit) of the organic light emitting display apparatus 100. The thin film transistor 120 includes a gate electrode 121, an active layer 122, a source electrode 123, and a drain electrode 124. In the organic light emitting display apparatus 100 according to an embodiment of the present disclosure, the thin film transistor 120 has a structure in which the active layer 122 is disposed over the gate electrode 121 and the source and drain electrodes 123 and 124 are disposed on the active layer 122. That is, the thin film transistor 120 may have a bottom gate structure in which the gate electrode 121 is disposed on the bottom, but embodiments are not limited thereto.

The gate electrode 121 of the thin film transistor 120 is disposed on the substrate 110 and may be disposed on the buffer layer 112. The gate electrode 121 may be formed of any one of various conductive or metal materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof. However, embodiments of the present disclosure are not limited thereto.

A gate insulating layer 113 is disposed on the gate electrode 121. The gate insulating layer 113 serves to electrically insulate the gate electrode 121 and the active layer 122 and may be formed of an insulating material. The gate insulating layer 113 may be formed of a single layer of an inorganic material such as silicon nitride (SiNx) or silicon oxide (SiOx) or a multilayer of silicon nitride (SiNx) or silicon oxide (SiOx). However, embodiments of the present disclosure are not limited thereto.

The active layer 122 is disposed on the gate insulating layer 113. The active layer 122 is disposed to overlap the gate electrode 121. For example, the active layer 122 may be formed of an oxide semiconductor, amorphous silicon (a-Si), polycrystalline silicon (poly-Si), an organic semiconductor, or the like.

The source electrode 123 and the drain electrode 124 are disposed on the active layer 122. The source electrode 123 and the drain electrode 124 are disposed on the same layer and are spaced apart from each other. The source electrode 123 and the drain electrode 124 may be electrically connected to the active layer 122 by contact with the active layer 122. The source electrode 123 and the drain electrode 124 may be formed of any one of various conductive or metal materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof. However, embodiments of the present disclosure are not limited thereto.

In some embodiments, an etch stopper may be disposed on the active layer 122 and between the active layer 122 and the source and drain electrodes 123 and 124. The etch stopper serves as a layer for suppressing damage to the surface of the active layer 122, for example by plasma, when the source electrode 123 and the drain electrode 124 are formed by patterning using etching.

Referring to FIG. 2, an overcoating layer 114 is disposed on the thin film transistor 120. The overcoating layer 114 serves as an insulating layer configured to protect the thin film transistor 120 and may further reduce steps of the layers disposed on the lower substrate 110. For example, the overcoating layer 114 may cover various layers disposed on the lower substrate 110 which have different heights or thicknesses, and the overcoating layer 114 may provide a surface (e.g., an upper surface) that is relatively planar or that otherwise reduces an occurrence of stepped height differences. The overcoating layer 114 may be formed of any one of acrylic-based resin, epoxy resin, phenol resin, polyamide-based resin, polyimide-based resin, unsaturated polyester-based resin, polyphenylene-based resin, poly(phenylenesulfide)-based resin, benzocyclobutene, and photoresist. However, embodiments of the present disclosure are not limited thereto.

Referring to FIG. 2, the organic light emitting element 140 is disposed on the overcoating layer 114. The organic light emitting element 140 is a self-light emitting element and may be driven by the thin film transistor 120 disposed in each circuit unit. The organic light emitting element 140 includes an anode 141, an organic emission layer 142 on the anode 141, and a cathode 143 on the organic emission layer 142.

The anode 141 is separately disposed in each sub-pixel SPX on the overcoating layer 114. The anode 141 may be electrically connected to the drain electrode 124 of the thin film transistor 120 through a contact hole formed in the overcoating layer 114. FIG. 2 illustrates that the anode 141 is electrically connected to the drain electrode 124 of the thin film transistor 120. However, the anode 141 may be electrically connected to the source electrode 123 of the thin film transistor 120 depending on the type of the thin film transistor 120.

The anode 141 may be formed of a conductive material capable of supplying holes to the organic emission layer 142. As described above, if the organic light emitting display apparatus 100 is of the bottom emission type, the anode 141 may be formed as a transparent conductive layer of a conductive material having a high work function. For example, the anode 141 may be formed of a transparent conductive material including indium-tin-oxide (ITO), indium-zinc-oxide (IZO), indium tin zinc oxide (ITZO), zinc oxide (ZnO), or tin oxide (TO). However, embodiments of the present disclosure are not limited thereto.

Referring to FIG. 2, a bank 115 is disposed on the anode 141 and the overcoating layer 114. The bank 115 serves as an insulating layer or a light-blocking layer to define adjacent sub-pixels SP. The bank 115 may be formed to expose a portion of the anode 141. For example, the bank 115 may be formed of an organic insulating material and may cover an edge of the anode 141, while a remaining portion of the anode 141 is not covered by the bank 115. The bank 115 may be formed of resin including polyimide, acryl, or benzocyclobutene, but is not limited thereto.

The organic emission layer 142 serves as a layer to emit light of a specific color. The organic emission layer 142 may include at least one of a red organic emission layer, a green organic emission layer, a blue organic emission layer, and a white organic emission layer. The organic emission layer 142 may be disposed between the anode 141 and the cathode 143. The organic emission layer 142 may be formed as a single emission layer or may have a structure in which a plurality of emission layers emitting light of different colors are laminated or layered on one another. Further, the organic emission layer 142 may also include various organic layers such as a hole injection layer, a hole transport layer, an electron transport layer, and an electron injection layer. Referring to FIG. 2, the organic emission layer 142 is disposed on the front surface of the lower substrate 110, and the organic emission layers 142 in the respective sub-pixels SPX are connected to each other. In some embodiments, all or some of the organic emission layers 142 may be disposed as separated from each other in the respective sub-pixel SP.

The cathode 143 is disposed on the organic emission layer 142. The cathode 143 may be formed of a conductive material capable of supplying electrons to the organic emission layer 142. As illustrated, the organic light emitting display apparatus 100 may be of the bottom emission type, and the cathode 143 may be formed of a metal material such as silver (Ag), copper (Cu), or a magnesium-silver alloy (Mg:Ag), however, embodiments of the present disclosure are not limited thereto.

In the present disclosure, the display part DP may be considered as a portion of the organic light emitting display apparatus 100 from which images may be displayed and which may be an assembly including a variety of components, material layers, features, and the like, including the thin film transistor 120 and the organic light emitting element 140 of each of the sub-pixels SP; however, it will be readily appreciated that additional components, circuitry, or the like may be included within the display part DP. For convenience of illustration, FIG. 3 schematically illustrates the display part DP in the active area AA where the thin film transistor 120 and the organic light emitting element 140 are disposed.

Referring to FIG. 2 and FIG. 3, an encapsulation layer 150 is disposed on the display part DP including the organic light emitting element 140. The encapsulation layer 150 serves as a sealing member to protect the organic light emitting element 140 against external moisture, air, impacts, and the like. The encapsulation layer 150 may seal the organic light emitting element 140 by contact with the buffer layer 112 formed of an inorganic material on the lower substrate 110. For example, the encapsulation layer 150 may be a single inorganic layer or may have a structure in which inorganic layers and organic layers are alternately laminated to one another, but embodiments are not limited thereto.

Referring to FIG. 2 and FIG. 3, the upper substrate 111 is disposed on the encapsulation layer 150. The upper substrate 111 may be disposed to overlap the entire active area AA and a portion of the non-active area NA, as illustrated in FIG. 3. However, embodiments of the present disclosure are not limited thereto. The upper substrate 111 may be disposed to overlap only the active area AA or to overlap both the active area AA and the non-active area NA. The upper substrate 111 protects the organic light emitting element 140 of the display part DP together with the encapsulation layer 150. The upper substrate 111 may protect the organic light emitting element 140 of the display part DP against external moisture, oxygen, impacts, and the like. The upper substrate 111 may be formed of a metal material or an alloy material which has high corrosion resistance and can be easily processed into foil or thin film. Examples of the metal material may include aluminum (Al), nickel (Ni), chromium (Cr), iron (Fe), Invar, and the like. Since the upper substrate 111 is formed of a metal material or an alloy material, it can be implemented in the form of an ultra-thin film and can provide high resistance to external impacts and scratches.

Referring to FIG. 2 and FIG. 3, an adhesive layer 160 may be disposed between the encapsulation layer 150 and the upper substrate 111. The adhesive layer 160 may bond the encapsulation layer 150 and the upper substrate 111 to one another, which may thus fix positions of the lower substrate 110 and the upper substrate 111 with respect to each other. The adhesive layer 160 may be formed of an adhesive material and may be a thermosetting, naturally-curable, or UV-curable adhesive. For example, the adhesive layer 160 may be formed of an optical clear adhesive (OCA), a pressure sensitive adhesive (PSA), or the like, but embodiments are not limited thereto.

The adhesive layer 160 may be disposed to cover the encapsulation layer 150 and the display part DP. For example, the display part DP (including the sub-pixels SPX and associated pixel circuits) may be sealed by the buffer layer 112 and the encapsulation layer 150, and the encapsulation layer 150 and the display part DP may be sealed or otherwise surrounded by the buffer layer 112 and the adhesive layer 160. The adhesive layer 160 may protect the organic light emitting elements 140 of the display part DP against external moisture, oxygen, impacts, and the like, together with the encapsulation layer 150 and an encapsulation substrate. In various embodiments provided herein, the adhesive layer 160 may further include a moisture absorbent material. The moisture absorbent material may include hygroscopic particles and may absorb moisture and oxygen from the outside to minimize or reduce permeation of moisture and oxygen into the components or circuitry of the display part DP, such as the pixel circuits.

Referring to FIG. 2 and FIG. 3, an optical layer 116 may be disposed under the lower substrate 110. The optical layer 116 may serve to enhance optical properties of the organic light emitting display apparatus 100. For example, the optical layer 116 may be one of various films such as a polarizing film, an anti-fingerprint film, a UV blocking film for reducing reflection of external light. However, embodiments of the present disclosure are not limited thereto. Further, the optical layer 116 may be omitted in some embodiments, and in other embodiments two or more optical layers 116 may be provided depending on the design of the organic light emitting display apparatus 100.

Referring to FIG. 3, a plurality of first pads P1 is disposed in the non-active area NA. The plurality of first pads P1 may serve as conductive elements for transferring various signals between the flexible film 130 and the display part DP and driving circuitry which may be included as part of the display part DP or may be separate from the display part DP. The plurality of first pads P1 may transfer various signals between the flexible film 130 and the display part DP, such as a data signal, a high-potential voltage, a low-potential voltage, and a clock signal, through a plurality of conductive lines. FIG. 3 illustrates that the plurality of first pads P1 is formed on the buffer layer 112. However, embodiments of the present disclosure are not limited thereto. In various embodiments, the plurality of first pads P1 may be formed on various insulating layers, for example, an inorganic insulating layer, which may be disposed in the non-active area NA.

Referring to FIG. 1 and FIG. 3, the flexible film 130 is disposed in the non-active area NA of the lower substrate 110. The flexible film 130 includes various components such as a driver IC 132 on a flexible base film 131. The flexible film 130 serves to supply signals to the plurality of sub-pixels SPX and the circuits in the active area AA. A second pad P2 of the flexible film 130 may be electrically connected to the first pad P1 disposed on the lower substrate 110. The flexible film 130 is disposed on one end of the non-active area NA and supplies a data signal, a high-potential voltage, a low-potential voltage, a clock signal, and the like, to the plurality of sub-pixels SPX and the circuits or circuitry in the active area AA. FIG. 1 illustrates six flexible films 130. However, the number of flexible films 130 is not limited thereto and may be changed variously depending on the design.

Referring to FIG. 3, a conductive adhesive layer 117 is disposed between the lower substrate 110 and the flexible film 130. The conductive adhesive layer 117 may adhere or fix the lower substrate 110 and the flexible film 130 to one another and electrically connect the first pad P1 on the lower substrate 110 to the second pad P2 of the flexible film 130. The conductive adhesive layer 117 may be formed by, for example, dispersing conductive materials in an adhesive material and may be formed as an anisotropic conductive film (ACF). Thus, the lower substrate 110 and the flexible film 130 may be fixed to one another by the adhesive material of the conductive adhesive layer 117. Also, the first pad P1 and the second pad P2 may be electrically connected to each other through electrical paths formed by the conductive particles.

Referring to FIG. 3, the protective layer 170 is disposed in the non-active area NA of the lower substrate 110. The protective layer 170 may serve to protect components disposed under the protective layer 170 during a repair process of the organic light emitting display apparatus 100. In some embodiments, the protective layer 170 may be formed of a ceramic material, for example, aluminum oxide (Al2O3), titanium oxide (TiO2), zinc oxide (ZnO), silicon carbide (SiC), or silicon nitride (Si3N4), but embodiments are not limited thereto. The function of the protective layer 170 during a repair process will be described later with reference to FIG. 4A through FIG. 4C.

The protective layer 170 may be disposed in the non-active area NA so as to surround the active area AA and surround the adhesive layer 160 and the upper substrate 111. Specifically, as illustrated in FIG. 3, the protective layer 170 may be disposed in the non-active area NA so as to surround side surfaces of the adhesive layer 160 and the upper substrate 111. In some embodiments, the protective layer 170 may have a square ring shape on a flat surface (e.g., in a top view), but embodiments are not limited thereto. Further, an outer edge of the protective layer 170 may be disposed on substantially the same line as an outer edge of the lower substrate 110. For example, outer lateral edges or side surfaces of the protective layer 170 may be substantially aligned with outer lateral edges or side surfaces of the lower substrate 110. Thus, the protective layer 170 may be at least partially disposed in the non-active area NA so as to cover a portion of the flexible film 130.

The protective layer 170 is disposed on the inorganic insulating layer, such as the buffer layer 112, the flexible film 130, and the conductive adhesive layer 117 in the non-active area NA. Further, the protective layer 170 may be in direct contact with the buffer layer 112, the flexible film 130 and the conductive adhesive layer 117 and may flatten or otherwise reduce or mitigate stepped height differences of the upper parts thereof. Thus, the protective layer 170 enables the sealing layer 190 disposed on the protective layer 170 to be formed on a flat surface.

Referring to FIG. 3, the metal layer 180 is disposed on the protective layer 170 in the non-active area NA of the lower substrate 110. The metal layer 180 may enable the sealing layer 190 formed on the metal layer 180 to be easily removed during a repair process of the organic light emitting display apparatus 100. In some embodiments, the metal layer 180 may be formed of a material which can be ionized in a solution process. In some embodiments, the metal layer 180 may be formed of a material which can be ionized by reaction with a halogen solution. For example, the metal layer 180 may be one of a first group of metals including manganese (Mn), nickel (Ni), chromium (Cr), tungsten (W), and the like or an alloy including any of these metals. In some embodiments, the metal layer 180 may be one of a second group of metals including aluminum (Al), copper (Cu), zinc (Zn), or tin (Sn) or an alloy including any of these metals. However, embodiments of the present disclosure are not limited thereto. The metals in the second metal group may be less likely to explode during an ionization process using a halogen solution than the metals in the first metal group. Thus, the metals in the second metal group or the alloys including such metals may be used as the metal layer 180. The function of the metal layer 180 during a repair process will be described later with reference to FIG. 4A through FIG. 4C.

The metal layer 180 may be disposed in the non-active area NA so as to surround the active area AA and surround the upper substrate 111. In some embodiments, as illustrated in FIG. 3, the metal layer 180 may be disposed in the non-active area NA so as to surround the side surfaces of the upper substrate 111, and the metal layer 180 may contact the side surfaces of the upper substrate 111. Thus, the metal layer 180 may have a square ring shape on a flat surface (e.g., in a top view), but embodiments are not limited thereto. Further, an outer edge of the metal layer 180 may be disposed on substantially the same line as the outer edge of the lower substrate 110. For example, outer lateral edges or outer side surfaces of the metal layer 180 may be substantially aligned with outer lateral edges or outer side surfaces of the lower substrate 110.

Referring to FIG. 1 and FIG. 3, the sealing layer 190 is disposed on the protective layer 170 and the metal layer 180 in the non-active area NA of the lower substrate 110. The sealing layer 190 may be provided to suppress moisture permeation through a side portion of the organic light emitting display apparatus 100 and minimize or reduce defects in follow-up processes. The sealing layer 190 may be formed of a UV-curable material in some embodiments. For example, the sealing layer 190 may be formed of a UV-curable material including a UV-curable oligomer such as epoxy acrylate, urethane acrylate, polyester acrylate, urethane or silicon acrylate. However, embodiments of the present disclosure are not limited thereto.

The sealing layer 190 may be disposed in the non-active area NA so as to surround the active area AA and surround the upper substrate 111. In some embodiments, as illustrated in FIG. 3, the sealing layer 190 may be disposed in the non-active area NA so as to surround the side surfaces of the upper substrate 111, and the sealing layer 190 may contact the side surfaces of the upper substrate 111. Thus, the sealing layer 190 may have a square ring shape on a flat surface (e.g., in a top view), but embodiments are not limited thereto.

In an organic light emitting display apparatus of a comparative example, only a sealing layer for suppressing moisture permeation through the side portion of the organic light emitting display apparatus and minimizing defects in follow-up processes is formed to cover a lower substrate and a flexible film. That is, the sealing layer is formed to be in direct contact with the flexible substrate. However, the sealing layer is formed by coating, such as printing, and curing and is formed of a low-viscosity material. Therefore, the sealing layer is relatively vulnerable to moisture permeation. Further, only the sealing layer is disposed on the side portion of the organic light emitting display apparatus, and, thus, there is a problem with moisture permeation through the side portion of the organic light emitting display apparatus. Therefore, a moisture absorbent may be added to the sealing layer to solve the problem with moisture permeation. However, an align key disposed under the sealing layer should be visible in follow-up processes, and, thus, the sealing layer should generally be transparent in the comparative example. Therefore, the moisture absorbent may present problems since adding the moisture absorbent to the sealing layer may obscure visibility through the sealing layer.

In the organic light emitting display apparatus 100 according to an embodiment of the present disclosure, a plurality of layers including the protective layer 170, the metal layer 180 and the sealing layer 190 is disposed on the side portion of the organic light emitting display apparatus 100. Thus, it is possible to improve moisture permeation through the side portion of the organic light emitting display apparatus 100. That is, the protective layer 170 formed of a ceramic material, the metal layer 180 formed of a metal material, and the sealing layer 190 are disposed sequentially on the lower substrate 110. Therefore, the three layers are present on the side portion of the organic light emitting display apparatus 100. Thus, the moisture permeation resistance can be improved, compared to a case where only the sealing layer 190 is disposed. Therefore, in the organic light emitting display apparatus 100 according to an embodiment of the present disclosure, it is possible to more effectively block moisture which may permeate through the side portion. Thus, the reliability can be improved.

An example process for manufacturing an organic light emitting display apparatus includes a process of fixing a flexible film to a lower substrate using a conductive adhesive layer on the lower substrate and then forming a sealing layer. In this case, before the sealing layer is formed, an inorganic insulating layer, such as a buffer layer, the conductive adhesive layer, and the flexible film are disposed on the surface of the lower substrate. In this case, the buffer layer, the conductive adhesive layer, and the flexible film are formed of different materials from each other. Therefore, the buffer layer, the conductive adhesive layer, and the flexible film coated with the sealing layer are different from each other in surface characteristics of their top surface. Further, the top surfaces of the buffer layer, the conductive adhesive layer, and the flexible film have different heights from each other. Thus, there are steps among the top surfaces of the buffer layer, the conductive adhesive layer, and the flexible film coated with the sealing layer. Therefore, the coating properties may be degraded during forming of the sealing layer. Also, a process defect may occur during manufacturing of the sealing layer. Particularly, an area where the flexible film is formed has poor roughness, and, thus, holes or bubbles may be formed in the sealing layer.

In the organic light emitting display apparatus 100 according to an embodiment of the present disclosure, the protective layer 170 and the metal layer 180 providing a flat surface under the sealing layer 190 are disposed. Thus, during forming of the sealing layer 190, the coating properties can be improved and the occurrence of process defects can be suppressed. That is, the protective layer 170 covering the top surfaces of the buffer layer 112, the conductive adhesive layer 117 and the flexible film 130 provides a flat top surface. Also, the metal layer 180 and the sealing layer 190 are formed sequentially on the protective layer 170. Therefore, the sealing layer 190 is also formed on a flat top surface of the metal layer 180 so as to be in contact with the top surface of the metal layer 180. In the organic light emitting display apparatus 100 according to an embodiment of the present disclosure, the sealing layer 190 is formed on a single metal layer 180 having uniform or substantially uniform surface characteristics. Also, the top surface of the metal layer 180 is flat. Therefore, the coating properties can be improved during forming of the sealing layer 190, and the occurrence of defect can be minimized or reduced during manufacturing of the sealing layer 190 or follow-up processes.

Meanwhile, the sealing layer may be manufactured through a curing process. For example, the sealing layer may be formed by coating a material constituting the sealing layer and curing the material through UV curing or the like. When the sealing layer is cured, it has excellent adhesive strength. Thus, it is very difficult to separate the sealing layer from a substrate or other structure, such as the lower substrate. Particularly, if the lower substrate is formed of a material having flexibility, the lower substrate may be damaged when the sealing layer is separated. Thus, if a defect occurs during manufacturing of the sealing layer, the entire organic light emitting display apparatus may need to be discarded.

Accordingly, in the organic light emitting display apparatus 100 according to an embodiment of the present disclosure, the metal layer 180 which can be ionized and removed during a solution process is disposed under the sealing layer 190. Thus, if a defect occurs during manufacturing of the sealing layer 190, a repair process for easily removing the sealing layer 190 can be performed.

Hereafter, a method of manufacturing an organic light emitting apparatus according to an embodiment of the present disclosure will be described in more detail with reference to FIG. 4A through FIG. 4C to explain the effect of the repair process in more detail.

Figure 4A:
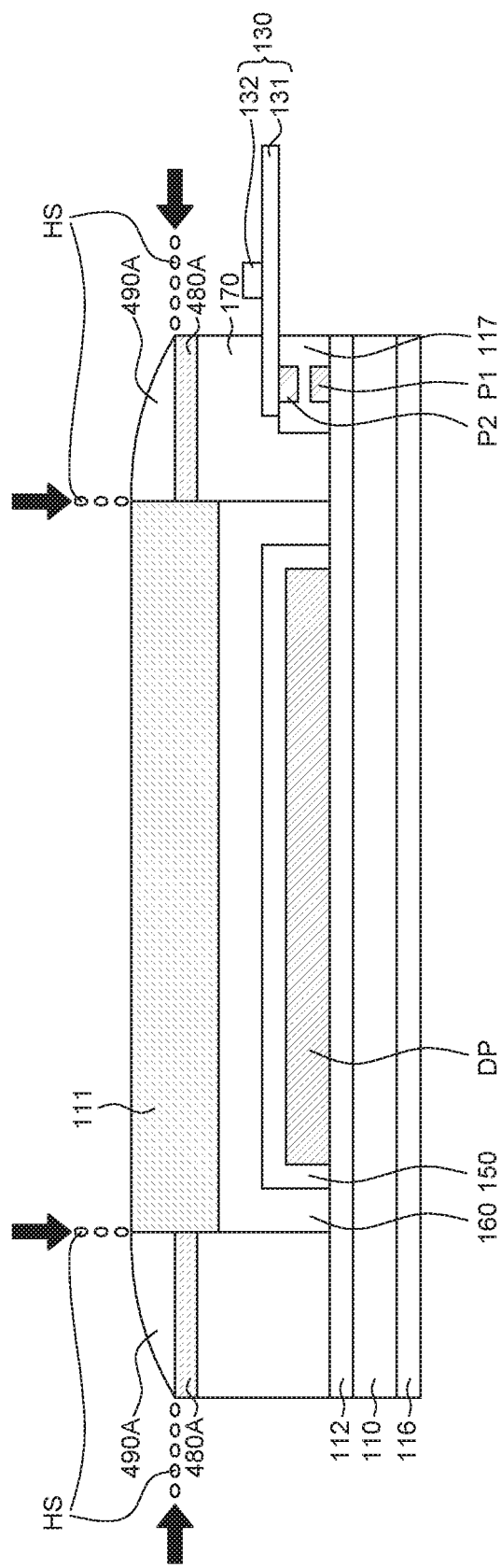
FIG. 4A through FIG. 4C are schematic cross-sectional views provided to explain a method of manufacturing an organic light emitting display apparatus according to an embodiment of the present disclosure.
Figure 4B:
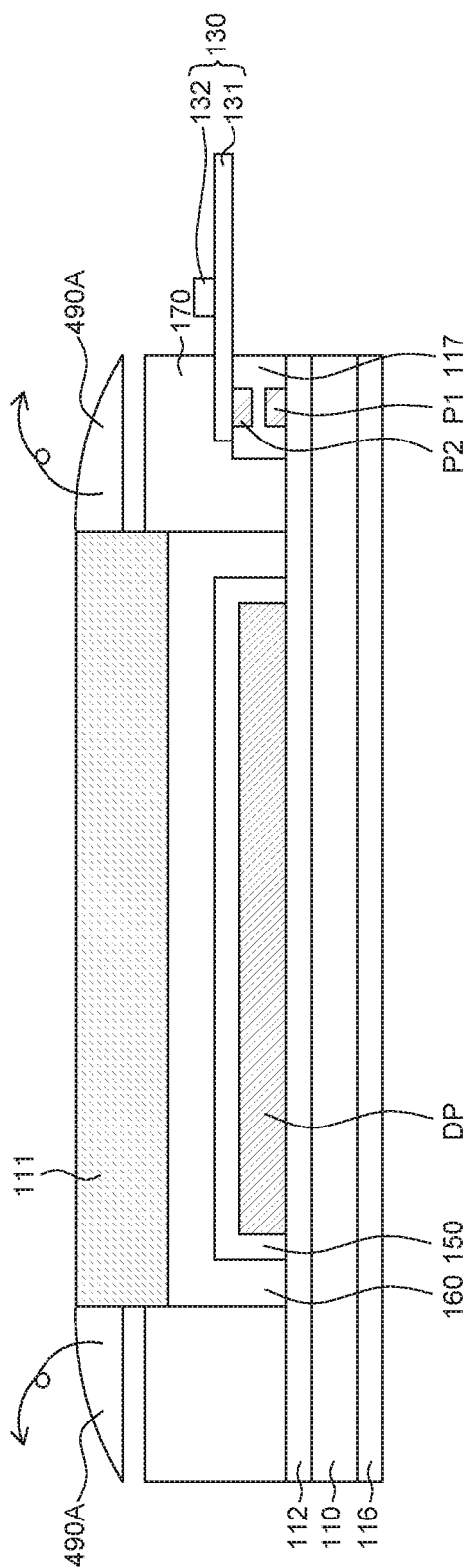
Figure 4C:
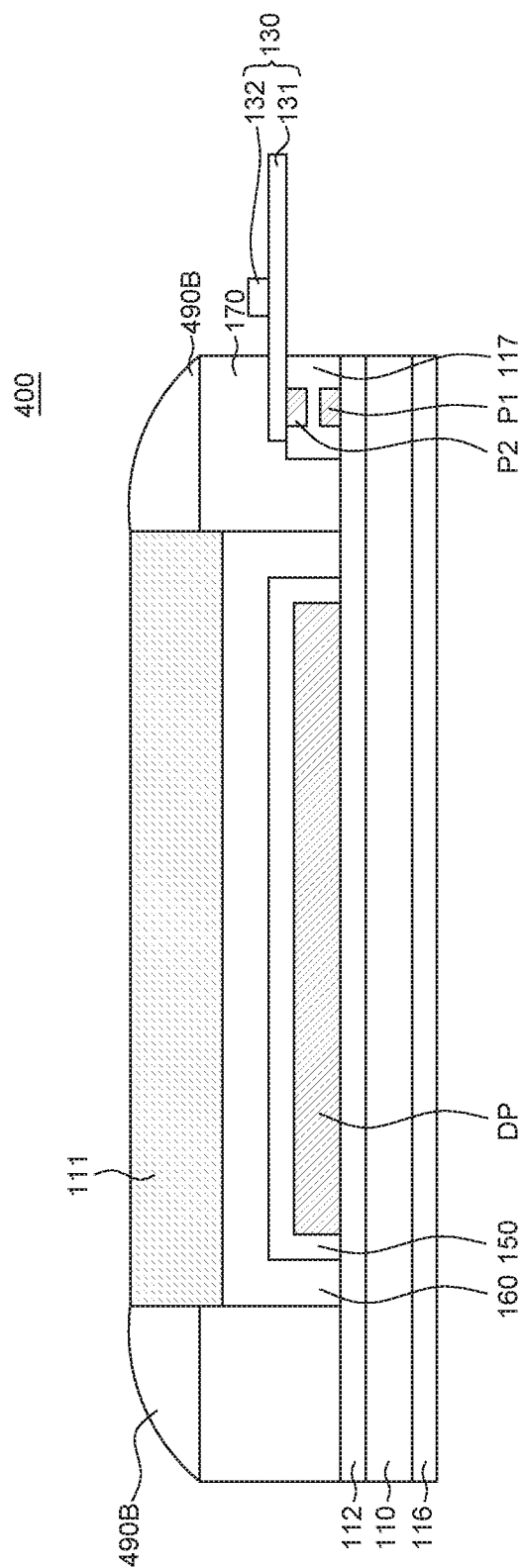

FIG. 4A through FIG. 4C are schematic cross-sectional views provided to explain a method of manufacturing an organic light emitting display apparatus according to an embodiment of the present disclosure. The method of manufacturing an organic light emitting display apparatus illustrated in FIG. 4A through FIG. 4C includes manufacturing the organic light emitting display apparatus 100 illustrated in FIG. 1 through FIG. 3 and a repair process performed when a defect occurs during manufacturing of the sealing layer 190.

Referring to FIG. 4A, in the method of manufacturing an organic light emitting display apparatus according to an embodiment of the present disclosure, the display part DP is formed in the active area AA of the lower substrate 110. Further, in the method of manufacturing an organic light emitting display apparatus, the encapsulation layer 150 is formed on the display part DP and the lower substrate 110 and the upper substrate 111 are bonded using the adhesive layer 160.

Then, in the method of manufacturing an organic light emitting display apparatus according to an embodiment of the present disclosure, the flexible film 130 is disposed in the non-active area NA of the lower substrate 110. Then, the protective layer 170 is formed in the non-active area NA so as to cover a portion of the flexible film 130. The protective layer 170 may be formed of a ceramic material, for example, aluminum oxide (Al2O3), titanium oxide (TiO2), zinc oxide (ZnO), silicon carbide (SiC), or silicon nitride (Si3N4), but embodiments are not limited thereto. Further, the protective layer 170 is formed after the organic light emitting element 140 of the display part DP is formed. Therefore, the protective layer 170 is not manufactured at a too high temperature and is not subjected to various processes and process conditions which may be utilized during manufacture or formation of the display part DP. Also, the protective layer 170 may be formed by printing and coating the material in a sol-type and then curing, coating through aerosol deposition (for example, coating with a mask), or atom layer deposition (ALD). However, embodiments of the present disclosure are not limited thereto.

Then, in the method of manufacturing an organic light emitting display apparatus according to an embodiment of the present disclosure, a first metal layer 480A is formed on the protective layer 170. The first metal layer 480A may be formed of a material which can be ionized by reaction with a halogen solution HS. For example, the first metal layer 480A may be one of a first metal group including manganese (Mn), nickel (Ni), chromium (Cr), tungsten (W), and the like or an alloy including any of these metals. In some embodiments, the first metal layer 480A may be one of a second metal group including aluminum (Al), copper (Cu), zinc (Zn), or tin (Sn) or an alloy including any of these metals. However, embodiments of the present disclosure are not limited thereto and other conductive materials, metals, or the like may be utilized for the first metal layer 480A in various embodiments. Further, the first metal layer 480A is formed after the organic light emitting element 140 of the display part DP is formed. Therefore, the first metal layer 480A is not manufactured at a too high temperature and is not subjected to various processes and process conditions which may be utilized during manufacture of formation of the display part DP. Also, the first metal layer 480A may be formed by printing and coating the ceramic material in a sol-type and then curing, or coating through aerosol deposition (for example, coating with a mask). However, embodiments of the present disclosure are not limited thereto. Herein, the first metal layer 480A is the same as the metal layer 180 described above with reference to FIG. 1 through FIG. 3.

Then, in the method of manufacturing an organic light emitting display apparatus according to an embodiment of the present disclosure, a first sealing layer 490A is formed on the first metal layer 480A. The first sealing layer 490A may be formed of a UV-curable material. For example, the first sealing layer 490A may be formed of a UV-curable material including a UV-curable oligomer such as epoxy acrylate, urethane acrylate, polyester acrylate, urethane or silicon acrylate. However, embodiments of the present disclosure are not limited thereto. The first sealing layer 490A may be formed by printing and coating such as screen printing, inkjet printing, dispenser printing, and gravure offset printing and then curing, but is not limited thereto. Herein, the first sealing layer 490A is the same as the sealing layer 190 described above with reference to FIG. 1 through FIG. 3.

As described above, the first sealing layer 490A is formed by curing through UV curing or the like. Thus, when the first sealing layer 490A is formed, it is very difficult to separate the first sealing layer 490A from the upper substrate 111, the lower substrate 110, or from any of the various layers formed on the upper or lower substrates 111, 110. Particularly, if the upper substrate 111 or lower substrate 110 is formed of a material having flexibility, the upper substrate 111 or lower substrate 110 may be damaged when the first sealing layer 490A is separated. However, in the method of manufacturing an organic light emitting display apparatus according to an embodiment of the present disclosure, a repair process can be performed to the first sealing layer 490A using the first metal layer 480A, which avoids or reduces damage to the upper substrate 111 or lower substrate 110.

Specifically, referring to FIG. 4A, the first metal layer 480A may be removed by reacting the first metal layer 480A with the halogen solution HS and ionizing the first metal layer 480A. As illustrated in FIG. 4A, the first metal layer 480A may be ionized by spraying the halogen solution HS to a side surface of the first metal layer 480A or an interface between the first sealing layer 490A and the upper substrate 111. A halogen element has seven peripheral electrons and thus is ionized into mainly a monovalent anion. Further, the halogen element easily reacts with all kinds of metal. Thus, for example, the halogen solution HS may be formed by mixing a halogen element such as iodine (I) with ethanol and the first metal layer 480A may be reacted with the ionized iodine (I) to remove the first metal layer 480A. Thus, it is possible to separate interfaces between the first metal layer 480A and the other neighboring components. That is, in the method of manufacturing an organic light emitting display apparatus according to an embodiment of the present disclosure, the first metal layer 480A can be removed by ionizing the first metal layer 480A with the halogen solution HS. Also, the protective layer 170 formed of a ceramic material is disposed under the first metal layer 480A. Thus, various components formed of metal materials and disposed under the protective layer 170 can be protected against the halogen solution HS used to remove the first metal layer 480A. FIG. 4A illustrates that the first metal layer 480A is removed by spraying the halogen solution HS to the first metal layer 480A. However, embodiments of the present disclosure are not limited thereto. The first metal layer 480A may be removed by immersing a side portion of the organic light emitting display apparatus where the first metal layer 480A is located in a material that ionizes or otherwise removes the first metal layer 480A, such as the halogen solution HS.

Then, referring to FIG. 4B, the first sealing layer 490A may be removed together with the first metal layer 480A. As described above, the first metal layer 480A may be removed through the process using the halogen solution HS. The first sealing layer 490A may be removed at the same time when the first metal layer 480A is removed. In some embodiments, when the first metal layer 480A is removed, the first sealing layer 490A may not be removed concurrently or simultaneously with the first metal layer 480A, but instead, the first sealing layer 490A may be removed subsequent to the removal of the first metal layer 480A. In some embodiments, since the first sealing layer 490A is fixed only to the upper substrate 111, the first sealing layer 490A may be separated easily from the upper substrate 111 by applying physical force thereto. That is, the first sealing layer 490A is not bonded to the buffer layer 112 or the lower substrate 110 (or to intermediate layers, such as the protective layer 170 between the lower substrate 110 and the first sealing layer 490A), but is bonded only to the upper substrate 111 (e.g., to side surfaces of the upper substrate 111), which may be formed of a metal material or an alloy material. Therefore, the first sealing layer 490A can be separated easily from the upper substrate 111.

Then, referring to FIG. 4C, a second sealing layer 490B may be formed on the protective layer 170. The second sealing layer 490B is formed after the first metal layer 480A and the first sealing layer 490A are removed. The second sealing layer 490B is formed to suppress moisture permeation through a side portion of an organic light emitting display apparatus 400 and minimize defects in follow-up processes. The second sealing layer 490B may be formed of the same material by the same process as the first sealing layer 490A.

In the method of manufacturing an organic light emitting display apparatus according to an embodiment of the present disclosure, the first metal layer 480A which can be ionized and removed during a solution process is used. Thus, it is possible to easily remove the first sealing layer 490A in the event a defect occurs, for example, in the first sealing layer 490A. Thus, in the method of manufacturing an organic light emitting display apparatus according to an embodiment of the present disclosure, a repair process can be performed to the first sealing layer 490A. For example, the first sealing layer 490A may be easily removed and replaced by a second sealing layer 490B. Thus, the manufacturing yield of the organic light emitting display apparatus 400 can be improved. As shown in FIG. 4C, the second sealing layer 490B may be formed in contact with the protective layer 170 and may have inner side surfaces (e.g., in contact with outer side surfaces of the upper substrate 111) which have a thickness extending from an upper surface of the protective layer 170 to a level that may be substantially coplanar with, or in some embodiments above, a level of the upper surface of the upper substrate 111. Thus, the thickness of the second sealing layer 490B may be greater than that of the first sealing layer 490A, since the first metal layer 480A has been removed.

Figure 5:
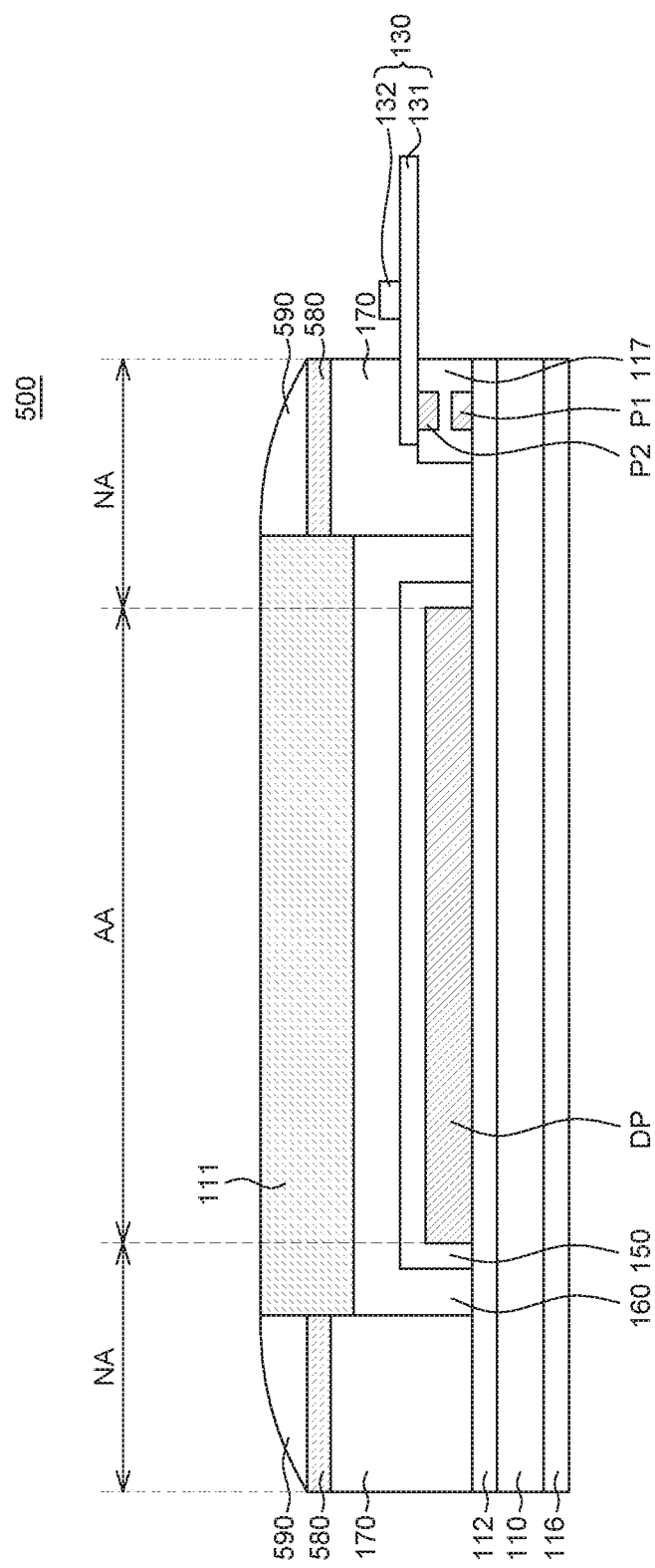
FIG. 5 is a schematic cross-sectional view of an organic light emitting display apparatus according to another embodiment of the present disclosure.

FIG. 5 is a schematic cross-sectional view of an organic light emitting display apparatus according to another embodiment of the present disclosure. An organic light emitting display apparatus 500 illustrated in FIG. 5 has substantially the same configuration as the organic light emitting display apparatus 400 illustrated in FIG. 4C except for differences in a second metal layer 580 and a second sealing layer 590. Therefore, redundant description of the same components will not be provided.

Referring to FIG. 5, the second metal layer 580 is disposed on the protective layer 170. The second metal layer 580 may be disposed in the non-active area NA so as to surround the active area AA and surround the upper substrate 111. The second metal layer 580 may be formed on the protective layer 170 after removing of the first metal layer 480A and the first sealing layer 490A described above with reference to FIG. 4A and FIG. 4B. The second metal layer 580 may enable the second sealing layer 590 formed on the second metal layer 580 to be easily removed so that an additional repair process can be performed after a first repair process. Thus, the second metal layer 580 may be formed of a material which can be ionized in a solution process. For example, the second metal layer 580 may be formed of a material which can be ionized by reaction with the halogen solution HS. For example, the second metal layer 580 may be one of a first metal group including manganese (Mn), nickel (Ni), chromium (Cr), tungsten (W), and the like or an alloy including any of these metals. In some embodiments, the second metal layer 580 may be one of a second metal group including aluminum (Al), copper (Cu), zinc (Zn), or tin (Sn) or an alloy including any of these metals. However, embodiments of the present disclosure are not limited thereto. The second metal layer 580 is substantially the same as the metal layer 180 described above with reference to FIG. 1 through FIG. 3 except that it is formed by the first repair process.

Referring to FIG. 5, the second sealing layer 590 may be disposed in the non-active area NA of the lower substrate 110 so as to surround the active area AA and surround the upper substrate 111. The second sealing layer 590 is formed to suppress moisture permeation through a side portion of the organic light emitting display apparatus 500 and minimize defects in follow-up processes. The second sealing layer 590 may be formed of a UV-curable material. For example, the second sealing layer 590 may be formed of a UV-curable material including a UV-curable oligomer such as epoxy acrylate, urethane acrylate, polyester acrylate, urethane or silicon acrylate. However, embodiments of the present disclosure are not limited thereto. The second sealing layer 590 may be substantially the same as the second sealing layer 490B described above with reference to FIG. 4C except that it is formed not on the protective layer 170 but on the second metal layer 580. Accordingly, the thickness of the second sealing layer 590 may be less than that of the second sealing layer 490B of FIG. 4C, since the second sealing layer 590 is formed on the second metal layer 580.

In the organic light emitting display apparatus 500 according to another embodiment of the present disclosure, the second metal layer 580 which can be ionized and removed during a solution process is used. Thus, it is possible to easily remove the second sealing layer 590 where a defect occurs. As described above, the second sealing layer 590 is formed by performing the first repair process to the sealing layer 190 (e.g., after removing the sealing layer 190 and forming the second sealing layer 590). However, a defect may still occur in the second sealing layer 590. Therefore, in the organic light emitting display apparatus 500 according to another embodiment of the present disclosure, the second metal layer 580 and a second sealing layer 590 are formed sequentially on the protective layer 170. This facilitates removal of the second sealing layer 590 in the event a defect is present in the second sealing layer 590. Thus, an additional repair process can be performed as needed. Since an additional repair process can be performed, the manufacturing yield of the organic light emitting display apparatus 500 can be improved and the manufacturing cost can be reduced.

Figure 6:
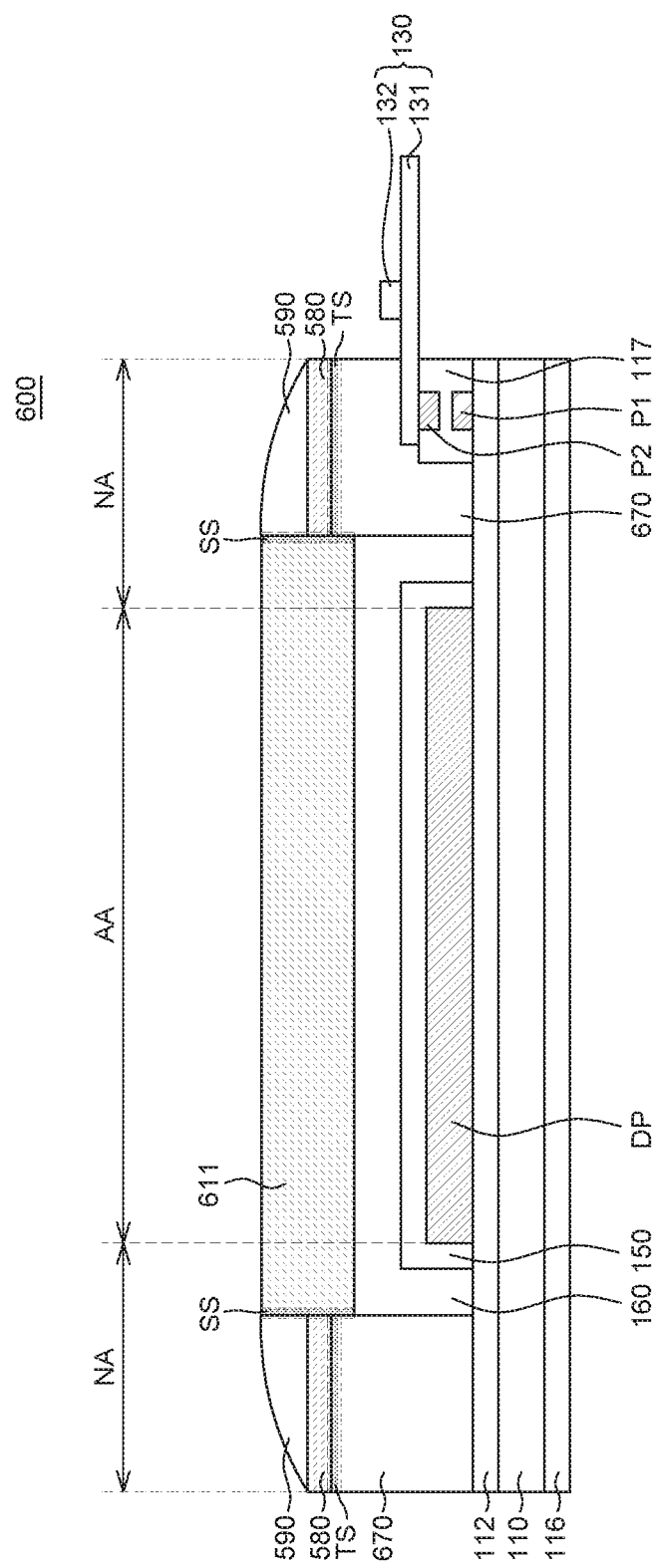
FIG. 6 is a schematic cross-sectional view of an organic light emitting display apparatus according to yet another embodiment of the present disclosure.

FIG. 6 is a schematic cross-sectional view of an organic light emitting display apparatus according to yet another embodiment of the present disclosure. An organic light emitting display apparatus 600 illustrated in FIG. 6 has substantially the same configuration as the organic light emitting display apparatus 500 illustrated in FIG. 5 except for differences in an upper substrate 611 and a protective layer 670. Therefore, redundant description of the same components will not be provided.

Referring to FIG. 6, residues generated during the repair process may be present on a top surface TS of the protective layer 670. For example, at least a portion of the top surface TS of the protective layer 670 may include an oxide of a material included in the protective layer 670. As described above, during the repair process, i.e., during removing of the metal layer on the protective layer 670, the halogen solution may be used. In this case, a portion or all of the top surface TS of the protective layer 670 may be oxidized by oxidation and reduction occurring while the halogen solution reacts with the metal layer 180 to remove the metal layer 180. Thus, at least a portion of the top surface TS of the protective layer 670 may include an oxide of a ceramic material included in the protective layer 670. Further, since at least a portion of the top surface TS of the protective layer 670 is oxidized, the top surface TS of the protective layer 670 may be different in color from the other portions of the protective layer 670.

Referring to FIG. 6, residues generated during the repair process may be present on a side surface SS of the upper substrate 611. For example, at least a portion of the side surface SS of the upper substrate 611 may include an oxide of a material included in the upper substrate 611. As described above, during the repair process, i.e., during removing of the metal layer surrounding the upper substrate 611, the halogen solution may be used. In some embodiments, a portion or all of the side surface SS of the upper substrate 611 may be oxidized by oxidation and reduction occurring while the halogen solution reacts with the metal layer. Further, the upper substrate 611 may be formed of a metal material or an alloy material, and, thus, the side surface SS of the upper substrate 611 may be oxidized by direct reaction with the halogen solution HS. Thus, at least a portion of the side surface SS of the upper substrate 611 may be formed of an oxide of a metal material or an alloy material constituting the upper substrate 611. Further, since at least a portion of the side surface SS of the upper substrate 611 is oxidized, the side surface SS of the upper substrate 611 may be different in color from a central portion of the upper substrate 611.

In the organic light emitting display apparatus 600 according to an embodiment of the present disclosure, the second metal layer 580 which can be ionized and removed during a solution process is used. Thus, it is possible to easily remove the second sealing layer 590 where a defect occurs. As described above, the second sealing layer 590 is formed by performing the first repair process to the sealing layer 190 (e.g., by removing the sealing layer 190 and forming the second sealing layer 590). However, a defect may still occur in the second sealing layer 590. Therefore, in the organic light emitting display apparatus 600 according to an embodiment of the present disclosure, the second metal layer 580 and second sealing layer 590 are formed sequentially on the protective layer 670, so that the second sealing layer 590 may be easily removed (e.g., by removal of the second metal layer 580 and the second sealing layer 590) in the event that defects are present in the second sealing layer 590. Thus, an additional repair process can be performed as needed. Since an additional repair process can be performed, the manufacturing yield of the organic light emitting display apparatus 600 can be improved and the manufacturing cost can be reduced.

Further, the organic light emitting display apparatus 600 according to an embodiment of the present disclosure may have undergone a repair process one or more times. Therefore, as described above, at least a portion of the side surface SS of the upper substrate 611 may be formed of an oxide of a material constituting the upper substrate 611. Also, at least a portion of the top surface TS of the protective layer 670 may be formed of an oxide of a material constituting the protective layer 670. Thus, it is possible to check whether the method of manufacturing an organic light emitting display apparatus according to an embodiment of the present disclosure is used, based on the protective layer 670 and the side surface SS of the upper substrate 611 of the organic light emitting display apparatus 600 according to an embodiment of the present disclosure.

Figure 7:
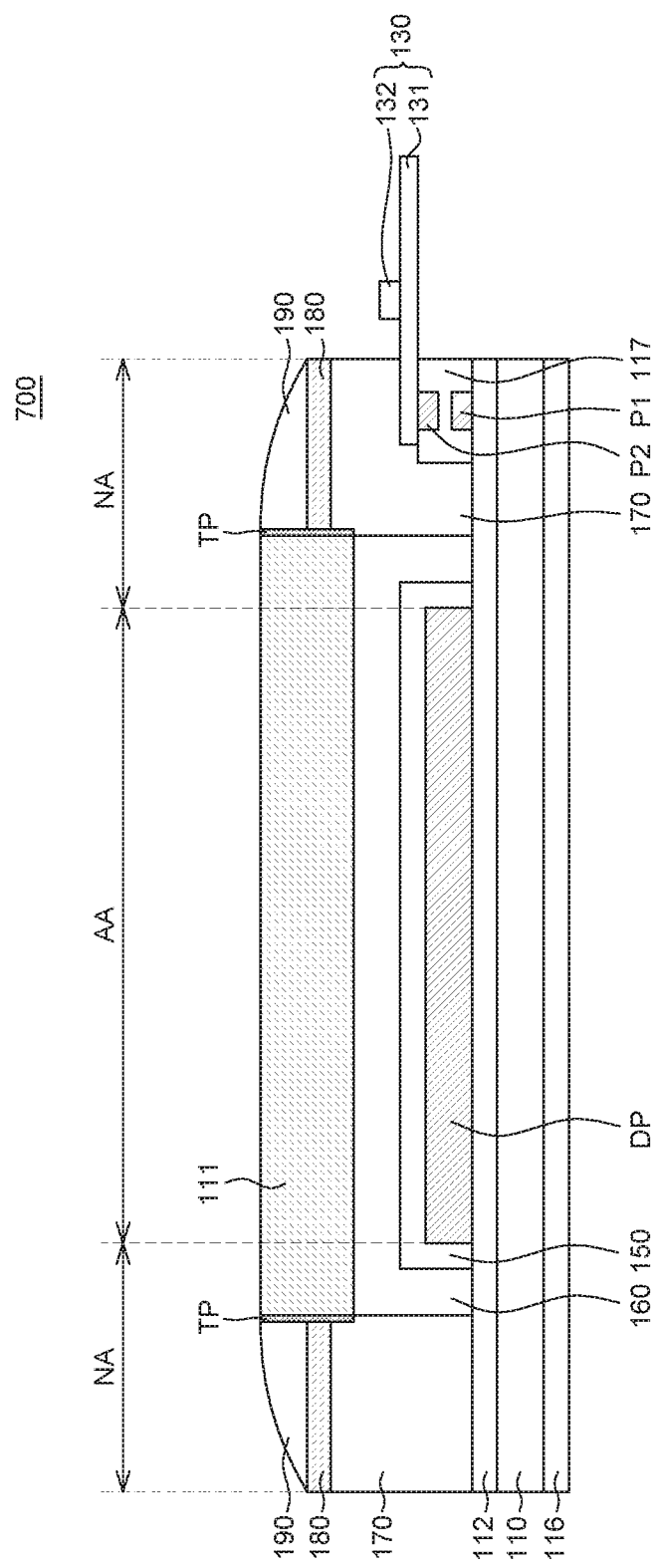
FIG. 7 is a schematic cross-sectional view of an organic light emitting display apparatus according to still another embodiment of the present disclosure.

FIG. 7 is a schematic cross-sectional view of an organic light emitting display apparatus according to still another embodiment of the present disclosure. An organic light emitting display apparatus 700 illustrated in FIG. 7 has substantially the same configuration as the organic light emitting display apparatus 100 illustrated in FIG. 1 through FIG. 3 except that a top protective member TP is added. Therefore, redundant description of the same components will not be provided.

Referring to FIG. 7, the top protective member TP is disposed to surround the side surface of the upper substrate 111. The top protective member TP serves to suppress damage to the upper substrate 111 during the repair process as described above. The upper substrate 111 serves to protect the organic light emitting element 140 of the display part DP against external moisture, oxygen, impacts, and the like together with the encapsulation layer 150. In some embodiments, the upper substrate 111 is formed of a material having high corrosion resistance. However, the side surface of the upper substrate 111 can be oxidized by the halogen solution HS used in the repair process as described above. Thus, the top protective member TP may be disposed to surround the side surface of the upper substrate 111 to minimize or reduce damage to the upper substrate 111 during the repair process. FIG. 7 illustrates that the top protective member TP is disposed only on the side surface of the upper substrate 111. However, embodiments of the present disclosure are not limited thereto. In various embodiments, the top protective member TP may be disposed in all areas between the upper substrate 111 and the sealing layer 190 and between the upper substrate 111 and the metal layer 180. Further, the top protective member TP may also be disposed partially or entirely on a top surface adjacent to the side surface of the upper substrate 111.

The top protective member TP may be formed of a material which does not react with the halogen solution used in the repair process. For example, the top protective member TP may be formed of an insulating material such as a ceramic material and may be formed of the same material as the protective layer 170, but embodiments are not limited thereto.

In the organic light emitting display apparatus 700 according to an embodiment of the present disclosure, the top protective member TP surrounding the side surface of the upper substrate 111 is used. Thus, it is possible to protect the upper substrate 111 during the repair process. Since the upper substrate 111 is formed of a metal material or an alloy material, the side surface of the upper substrate 111 may be damaged by reaction with the halogen solution used in the repair process. The upper substrate 111 is larger in size than the metal layer 180 which is ionized by reaction with the halogen solution. Therefore, damage to a portion of the side surface of the upper substrate 111 may not affect the reliability of the organic light emitting display apparatus 700. However, in the organic light emitting display apparatus 700 according to an embodiment of the present disclosure, the top protective member TP is disposed to surround the side surface of the upper substrate 111. Thus, it is possible to fundamentally suppress damage to the upper substrate 111 during a repair process. That is, since the top protective member TP is present during a repair process, the upper substrate 111 may not be damaged. Therefore, the upper substrate 111 can be protected and the reliability of the organic light emitting display apparatus 700 can be improved.

Figure 8:
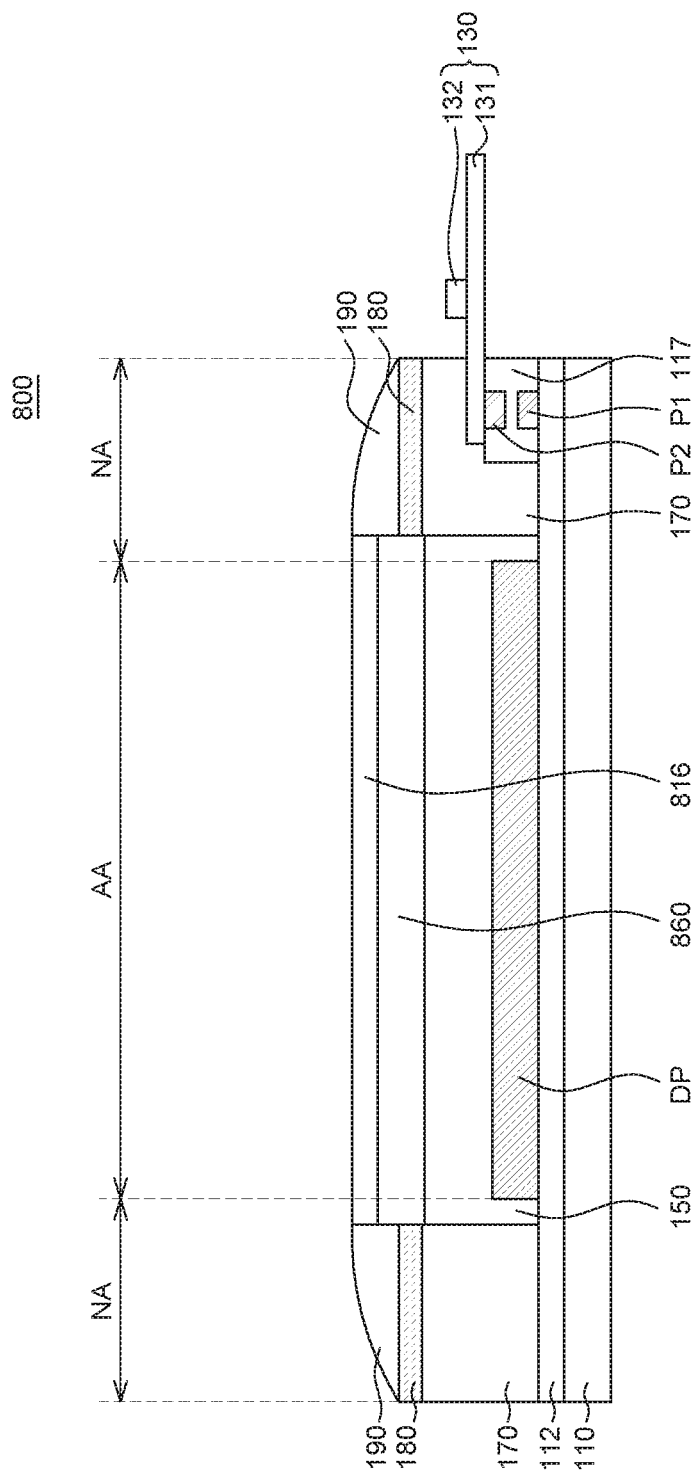
FIG. 8 is a schematic cross-sectional view of an organic light emitting display apparatus according to still another embodiment of the present disclosure.

FIG. 8 is a schematic cross-sectional view of an organic light emitting display apparatus according to still another embodiment of the present disclosure. An organic light emitting display apparatus 800 illustrated in FIG. 8 has substantially the same configuration as the organic light emitting display apparatus 100 illustrated in FIG. 1 through FIG. 3 except that the organic light emitting display apparatus 800 is of a top emission type and an adhesive layer 860 and an optical layer 816 are changed. Therefore, redundant description of the same components will not be provided.

The organic light emitting display apparatus 800 illustrated in FIG. 8 is of the top emission type. Thus, the anode of the organic light emitting element in the display part DP may include a reflective layer formed of a metal material having high reflexibility. The anode may also include a transparent conductive layer disposed on the reflective layer and formed of a conductive material having a high work function. Therefore, light emitted from the organic emission layer of the organic light emitting element may be discharged through the cathode toward the upper side of the organic light emitting display apparatus 800.

Further, the cathode disposed on the organic emission layer may be formed of a transparent conductive material including indium-tin-oxide (ITO), indium-zinc-oxide (IZO), indium tin zinc oxide (ITZO), zinc oxide (ZnO), and tin oxide (TO) or an ytterbium (Yb) alloy. In various embodiments, the cathode may be formed of a metal material having a very small thickness.

Referring to FIG. 8, the optical layer 816 is disposed on or over the encapsulation layer 150. The optical layer 816 may serve to enhance optical properties of the organic light emitting display apparatus 800. For example, the optical layer 816 may be one of various films such as a polarizing film, an anti-fingerprint film, and a UV blocking film for reducing reflection of external light. However, embodiments of the present disclosure are not limited thereto. Further, the optical layer 816 may be omitted in some embodiments, and in other embodiments two or more optical layers 816 may be provided depending on the design of the organic light emitting display apparatus 800.

Referring to FIG. 8, an adhesive layer 860 may be disposed between the encapsulation layer 150 and the optical member 816. The adhesive layer 860 may bond the encapsulation layer 150 and the optical layer 816 to one another and may fix the lower substrate 110 and the upper substrate 111. The adhesive layer 860 may be formed of an adhesive material and may be a thermosetting, naturally-curable, or UV-curable adhesive. For example, the adhesive layer 860 may be formed of an optical clear adhesive (OCA), a pressure sensitive adhesive (PSA), or the like, but embodiments are not limited thereto.

Referring to FIG. 8, the protective layer 170, the metal layer 180 and the sealing layer 190 are disposed in the non-active area NA so as to surround the active area AA. Also, the protective layer 170, the metal layer 180 and the sealing layer 190 may be disposed to surround side surfaces of the adhesive layer 860 and the optical layer 816.

In the organic light emitting display apparatus 800 according to an embodiment of the present disclosure, a plurality of layers including the protective layer 170, the metal layer 180 and the sealing layer 190 is disposed on a side portion of the organic light emitting display apparatus 800. Thus, it is possible to improve moisture permeation through the side portion of the organic light emitting display apparatus 800. That is, the protective layer 170 formed of a ceramic material, the metal layer 180 formed of a metal material, and the sealing layer 190 are disposed sequentially on the lower substrate 110. These three layers are present on the side portion of the organic light emitting display apparatus 800. Thus, the moisture permeation resistance can be improved, compared to a case where only the sealing layer 190 is disposed. Therefore, even in the organic light emitting display apparatus 800 of the top emission type according to an embodiment of the present disclosure, it is possible to more effectively block moisture which may permeate through the side portion. Thus, the reliability can be improved.

In the organic light emitting display apparatus 800 according to an embodiment of the present disclosure, the protective layer 170 and the metal layer 180 providing a flat surface under the sealing layer 190 are disposed. Thus, during forming of the sealing layer 190, the coating properties can be improved and the occurrence of process defects can be suppressed. That is, the protective layer 170 covering the top surfaces of the buffer layer 112, the conductive adhesive layer 117 and the flexible film 130 provides a flat top surface. Also, the metal layer 180 and the sealing layer 190 are formed sequentially on the protective layer 170. Therefore, the sealing layer 190 is also formed on a flat top surface of the metal layer 180 so as to be in contact with the top surface of the metal layer 180. Therefore, even in the organic light emitting display apparatus 800 of the top emission type according to an embodiment of the present disclosure, the sealing layer 190 is formed on a single metal layer 180 having uniform surface characteristics. Also, the top surface of the metal layer 180 is flat. Therefore, the coating properties can be improved during forming of the sealing layer 190, and the occurrence of defects can be minimized or reduced during manufacturing of the sealing layer 190 or follow-up processes.

Further, in the organic light emitting display apparatus 800 according to an embodiment of the present disclosure, the metal layer 180 which can be ionized and removed during a solution process is used. Thus, it is possible to easily remove the sealing layer 190 where a defect occurs. Accordingly, even in the organic light emitting display apparatus 800 of the top emission type according to an embodiment of the present disclosure, a repair process can be performed to the sealing layer 190. Thus, the manufacturing yield of the organic light emitting display apparatus 800 can be improved.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a first substrate;
   a display assembly on the first substrate, the display assembly including a plurality of sub-pixels, a portion of the first substrate extending laterally beyond a periphery of the display assembly;
   a second substrate on the display assembly;
   a protective layer on the portion of the first substrate extending laterally beyond the periphery of the display assembly;
   a metal layer on the protective layer; and
   a sealing layer on the metal layer,
   wherein the protective layer, the metal layer and the sealing layer are disposed in a non-active area only,
   wherein the metal layer contacts side surfaces of the second substrate.

2. The display device of claim 1, wherein the metal layer is formed of a metal material which can be ionized by reaction with a halogen solution.

3. The display device of claim 1, wherein the display assembly is disposed between the first substrate and the second substrate.

4. The display device of claim 3 wherein the sealing layer contacts the side surfaces of the second substrate.

5. The display device of claim 1, wherein the second substrate is formed of a metal material, and a portion of the second substrate at side surfaces of the second substrate includes an oxide of the metal material.

6. The display device of claim 1, wherein the metal layer laterally surrounds the second substrate.

7. The display device of claim 1, further comprising:
   a buffer layer on the first substrate;
   an encapsulation layer on the display assembly, the encapsulation layer contacting the buffer layer; and
   an adhesive layer on the encapsulation layer, the adhesive layer spaced apart from the buffer layer by the display assembly and the encapsulation layer,
   wherein the metal layer and the sealing layer contact side surfaces of the adhesive layer.

8. The display device of claim 1, further comprising:
   a first electrical pad on the portion of the first substrate extending laterally beyond the periphery of the display assembly;
   a flexible film including a second electrical pad disposed over the first electrical pad; and
   a conductive adhesive layer extending between the first electrical pad and the second electrical pad,
   wherein the protective layer contacts portions of the conductive adhesive layer and the flexible film.

9. The display device of claim 1, further comprising:
   a buffer layer on the first substrate;
   an encapsulation layer on the display assembly, the encapsulation layer contacting the buffer layer; and
   an adhesive layer on the encapsulation layer, the adhesive layer contacting the buffer layer,
   wherein the protective layer laterally surrounds the adhesive layer and contacts the buffer layer.

10. The display device of claim 9 wherein the adhesive layer includes a moisture absorbent material.

11. The display device of claim 1 wherein the protective layer is formed of a ceramic material, and a portion of the protective layer at a surface of the protective layer that is opposite the first substrate includes an oxide of the ceramic material.

12. A method, comprising:
   forming a display assembly in a display area of a substrate, the display assembly including a plurality of sub-pixels, the substrate having a non-display area extending laterally beyond a periphery of the display assembly;
   forming a second substrate on the display assembly;
   forming a protective layer on the substrate in the non-display area;
   forming a first metal layer on the protective layer in the non-display area; and
   forming a first sealing layer on the first metal layer in the non-display area,
   wherein the protective layer, first metal layer, and the first sealing layer are disposed in the non-display area only,
   wherein the first metal layer contacts side surfaces of the second substrate.

13. The method of claim 12, further comprising:
   removing the first metal layer;
   removing the first sealing layer; and
   forming a second sealing layer on the protective layer in the non-display area.

14. The method of claim 13 wherein the removing the first metal layer includes removing the first metal layer by exposing the first metal layer to a halogen solution.

15. The method of claim 13, further comprising:
   forming a second metal layer on the protective layer in the non-display area, subsequent to the removing the first metal layer and the removing the first sealing layer,
   wherein the forming the second sealing layer includes forming the second sealing layer on the second metal layer.

16. The method of claim 12 wherein the protective layer, the first metal layer, and the first sealing layer are formed by a coating process.

17. The method of claim 12, further comprising:
   disposing a flexible film in the non-display area of the substrate, the protective layer covering at least a portion of the flexible film.

18. An organic light emitting display apparatus, comprising:
   a first substrate having an active area and a non-active area at least partially surrounding the active area;

a display assembly on the first substrate in the active area;
a second substrate on the first substrate, the second substrate overlapping the active area;
a flexible film disposed in the non-active area;
a protective layer disposed in the non-active area, the protective layer covering at least a portion of the flexible film;
a metal layer disposed on the protective layer; and
a sealing layer disposed on the metal layer,
wherein the protective layer, the metal layer and the sealing layer are disposed in the non-active area only,
wherein the metal layer contacts side surfaces of the second substrate.

19. The organic light emitting display apparatus of claim 18 wherein the first substrate is formed of a material having flexibility.

20. The organic light emitting display apparatus of claim 18 wherein the protective layer is formed of a ceramic material.

21. The organic light emitting display apparatus of claim 18 wherein at least a portion of the protective layer at a surface that is opposite the first substrate includes an oxide of a material constituting the protective layer.

22. The organic light emitting display apparatus of claim 18 wherein the metal layer is formed of a material which can be ionized by reaction with a halogen solution.

23. The organic light emitting display apparatus of claim 18, wherein the protective layer, the metal layer, and the sealing layer are disposed in the non-active area and laterally surround the active area.

24. The organic light emitting display apparatus of claim 18, further comprising:
an inorganic insulating layer disposed in the active area and the non-active area;
a plurality of pads disposed in the non-active area; and
a conductive adhesive layer that electrically connects the plurality of pads to the flexible film and fixes the flexible film to the first substrate,
wherein the protective layer is in direct contact with the inorganic insulating layer, the flexible film, and the conductive adhesive layer, the protective layer having a substantially planar surface opposite the first substrate.

25. The organic light emitting display apparatus of claim 18, further comprising:
an adhesive layer on the first substrate, the adhesive layer fixes positions of the first substrate and the second substrate relative to one another,
wherein the protective layer and the sealing layer are disposed in the non-active area and surround side surfaces of the second substrate and the adhesive layer.

26. The organic light emitting display apparatus of claim 18 wherein the second substrate is formed of a metal material or an alloy material, and
at least a portion of the side surfaces of the second substrate includes an oxide of the metal material or the alloy material.

27. The organic light emitting display apparatus of claim 25 wherein the side surfaces of the second substrate are different in color from a central portion of the second substrate.

28. The organic light emitting display apparatus of claim 25, further comprising:
a protective member surrounding the side surfaces of the second substrate.

29. The organic light emitting display apparatus of claim 18, further comprising:
at least one optical film disposed on the first substrate in the active area; and
an adhesive layer fixing the at least one optical film to the first substrate,
wherein the protective layer and the sealing layer surround side surfaces of the at least one optical film and the adhesive layer.

* * * * *